United States Patent [19]

Armstrong et al.

[11] Patent Number: 4,686,651

[45] Date of Patent: Aug. 11, 1987

[54] POWER SWITCHED READ-ONLY MEMORY

[75] Inventors: Bruce G. Armstrong, Belmont; Fabio Principi, Cupertino, both of Calif.

[73] Assignee: Raytheon Company, Lexington, Mass.

[21] Appl. No.: 671,710

[22] Filed: Nov. 15, 1984

[51] Int. Cl.⁴ .................... G11C 8/00; G11C 17/00
[52] U.S. Cl. .................................................. 365/226
[58] Field of Search .................. 365/226, 227, 229, 96

[56] References Cited

U.S. PATENT DOCUMENTS

| | | | |
|---|---|---|---|
| 4,174,541 | 11/1979 | Schmitz | 365/227 |
| 4,329,685 | 5/1982 | Mahon et al. | 365/96 |
| 4,385,368 | 5/1983 | Principi et al. | 365/105 |

Primary Examiner—James W. Moffitt
Attorney, Agent, or Firm—Peter J. Devlin; Richard M. Sharkansky

[57] ABSTRACT

A memory integrated circuit component comprises: a memory; addressing circuitry for the memory; and, power switch circuit, programmable to either: (a) electrically couple or decouple the addressing circuitry and a power supply selectively in accordance with an enable signal; or, (b) maintain the addressing circuitry electrically coupled to the power supply independent of the enable signal.

With such arrangement, an integrated circuit component manufacturer avoids having to produce two separate types of non-volatile integrated circuit memories (i.e., a power switched component and a non-power switched component), but rather such manufacturer is able to fabricate a common non-volatile integrated circuit memory component which may be programmed after fabrication by either the user or the manufacturer as either a non-power switched memory component or a power switched memory component.

4 Claims, 1 Drawing Figure

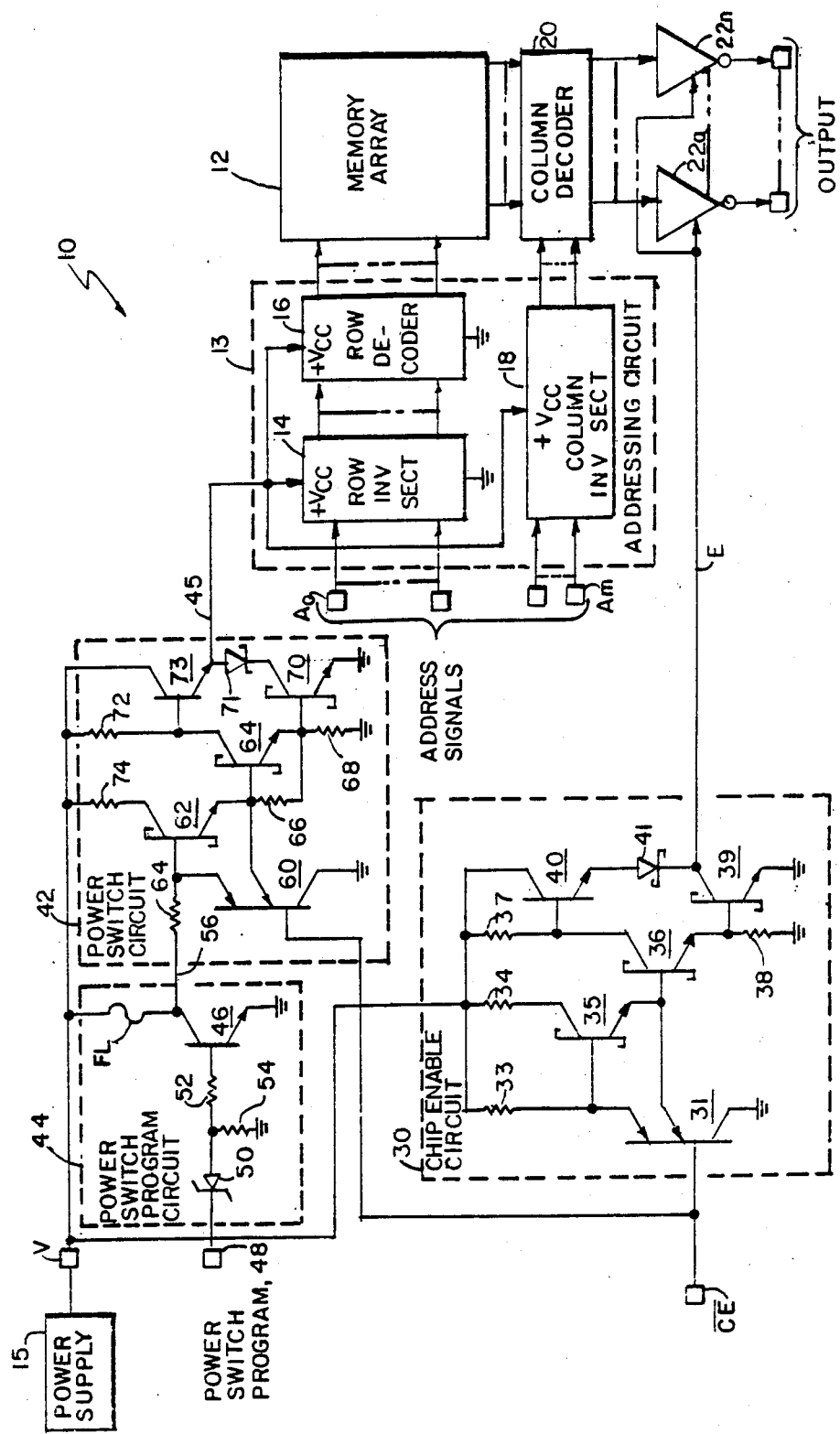

POWER SWITCHED READ-ONLY MEMORY

BACKGROUND OF THE INVENTION

This invention relates generally to integrated circuit read-only memories.

As is known in the art, read-only memory (ROM) and programmable read-only memory (PROM) components are widely used for storage of data such as program and microprogram control instructions because such components are relatively fast and non-volatile, retaining such instructions even when supply power is removed from the component. Further, such ROM/PROM components are typically fabricated as integrated circuit components. Each such ROM/PROM integrated circuit component generally includes a memory array of non-volatile memory elements coupled to addressing and output circuitry. In order to reduce the amount of power consumed by the addressing ciruitry when such ROM/PROM is not selected for reading the instructions stored therein, one type of ROM/PROM integrated circuit component is provided with a standby power enable circuit as described in U.S. Pat. No. 4,174,541, entitled "Bipolar Monolithic Integrated Circuit Memory With Standby Power Enable", inventor Charles R. Schmitz, issued Nov. 13, 1979, and assigned to the same assignee as the present invention. Thus, the user has the option of purchasing for a particular application either a non-power switched ROM/PROM component or a power switched ROM/PROM component.

SUMMARY OF THE INVENTION

In accordance with the present invention, a memory integrated circuit component comprises: a memory; means for addressing the memory; and, means, programmable to either: (a) electrically couple or decouple the addressing means and a power supply selectively in accordance with an enable signal; or, (b) maintain the addressing means electrically coupled to the power supply independent of the enable signal.

With such arrangement, an integrated circuit component manufacturer avoids having to produce two separate types of non-volatile integrated circuit memories (i.e., a power switched component and a non-power switched component), but rather such manufacturer is able to fabricate a common non-volatile integrated circuit memory component which may be programmed after fabrication by either the user or the manufacturer as either a non-power switched memory component or a power switched memory component.

BRIEF DESCRIPTION OF THE DRAWING

The foregoing aspects and other features of the invention are explained in more detail in the following description taken in conjunction with the accompanying drawing which shows a schematic diagram of a read-only memory (ROM) component according to the invention.

DESCRIPTION OF THE PREFERRED EMBODIMENT

Referring now to the single FIGURE, a read-only memory (ROM) component 10 is shown to include: a non-volatile memory array 12, addressing circuitry 13 (including a plurality of inverters and logic gates arranged in a conventional manner as a row address inverter section 14, a row decoder 16, and a column address inverter section 18); a column decoder 20; and a plurality of tri-state output buffers 22a–22n arranged as shown to read data stored in the memory array 12 (either by conventional mask programming the memory elements in the array 12 or by conventional electrically programming the memory elements in the array 12) in response to address signals fed to address terminals $A_o$–$A_m$ when such ROM component 10 is both coupled to a suitable power supply 15 via power supply terminal V and when enabled by a "low" chip enable signal fed to a chip enable terminal $\overline{CE}$. The ROM component 10 is adapted for programming after fabrication by either the integrated circuit manufacturer or the purchaser of the component as either: (a) a ROM component which, when coupled to a power supply 15 via power supply terminal V, has the addressing circuitry 13 thereof (i.e., the row address inverter section 14, the row decoder 16 and the column address inverter section 18) electrically coupled to such power supply 15 via power supply terminal V independent of whether the ROM component 10 is enabled by the chip enable signal (i.e., a non-power switched component); or (b) a ROM component 10 which, when coupled to the power supply 15 via power supply terminal V has the addressing circuitry 13 electrically coupled to power supply terminal V only when the component 10 is enabled in response to the "low" chip enable signal (i.e, a power switched component). Thus, the integrated circuit manufacturer is able to produce a common ROM component which the manufacturer, or user, is able to subsequently program, in a manner to be described, as either a power switched ROM component or a non-power switched ROM component.

More particularly, ROM component 10 includes a chip enable circuit 30, here an inverter, which enables operation of the ROM component 10 in response to a "low" chip enable signal fed to terminal $\overline{CE}$ and which places the ROM component 10 in a stand-by mode in response to a "high" chip enable signal fed to terminal $\overline{CE}$. Thus, the chip enable circuit 30 produces an enable signal on Line E, such enable signal here being a "low" signal when the chip enable signal at terminal $\overline{CE}$ is a relatively "high" signal, thereby placing the output buffers 22a–22n in a disabled, stand-by, or "high" output impedance state. Conversely, the enable signal on Line E is a "high" signal when the chip enable signal at terminal $\overline{CE}$, is "low", thereby placing the output buffers 22a–22n in an enable state. When placed in the enable state, the outputs of such buffers 22a–22n represent the logic states of the data stored in the memory array 12 and addressed by the addressing signals fed to the addressing circuitry 13.

Thus, the chip enable circuit 30 includes a transistor 31 having a base electrode coupled to the chip enable terminal $\overline{CE}$, a grounded collector electrode, and a pair of emitter electrodes; a first emitter electrode being coupled to: the power supply terminal V through a resistor 33 and to the base electrode of Schottky transistor 35; and the second emitter electrode being coupled to the emitter of transistor 35 and the base electrode of Schottky transistor 36. The collector electrode of transistor 35 is coupled to power supply terminal V through resistor 34. The collector of transistor 36 is coupled to power supply terminal V via resistor 37 and is also coupled to the base electrode of transistor 40. The collector of transistor 40 is connected to the power supply terminal V, as shown. The emitter of transistor 36 is coupled to ground through resistor 38 and to the base electrode of grounded emitter Schottky transistor 39. The collector electrode of transistor 39 is coupled to the emitter of transistor 40 through a Schottky diode 41, as shown, and to the enable/disable outputs of buffers 22a-22n via Line E. In operation, when the component 10 is in a stand-by mode, the chip enable signal fed to terminal $\overline{CE}$ is "high", thus, transistor 31 is in a non-conducting condition while transistors 35, 36, and 39 are in a conducting condition (i.e., transistor 39 being in saturation) to produce a "low" signal on Line E, thus, disabling output buffers 22a-22n. When it is desired to enable the ROM component 10, the chip enable signal at terminal $\overline{CE}$ is made "low". In response to such "low" signal, transistor 31 is placed in a conducting state, transistors 35, 36 and 39 are placed in non-conducting states, transistor 40 conducts, however, to produce a "high" signal on Line E thereby placing the output buffers 22a-22n in the enable state.

The chip enable terminal $\overline{CE}$ is also electrically coupled to a power switch circuit 42, such power switch circuit 42 being coupled to a power switch programming circuit 44 and also to addressing circuitry 13 via a power bus 45. Power switch programming circuit 44 includes a grounded emitter transistor 46 having the base electrode thereof coupled to a power switch program terminal 48 via a serially connected zener diode 50 and resistor 52, as shown. The anode of zener diode 50 is also coupled to ground through a resistor 54, as shown. The collector electrode of transistor 46 is coupled to the power supply terminal V through a conventional fusible link FL, as shown. Additionally, the collector electrode of transistor 46 is fed to the power switch circuit 42 via a power switch enable line 56. Briefly, when a suitable power supply 15 is coupled to the power supply terminal V and with the fusible link FL providing an electrical coupling between such power supply terminal V and the collector of electrode 46, the voltage of the power supply 15 is coupled to the power switch circuit 42 via power switch circuit enable line 56 thereby enabling switching operation of the power switch circuit 42. That is, with the fusible link FL providing the electrical coupling between the power supply terminal V and the collector of transistor 46 in the absence of a "low" chip enable signal on terminal $\overline{CE}$ (that is when the signal on terminal $\overline{CE}$ is "high"), the power switch circuit 42 electrically decouples the power supply terminal V from the power bus 45, and hence from the addressing circuitry 13 to reduce power consumption. In the presence of a "low" chip enable signal at chip enable terminal $\overline{CE}$, the power switch circuit 42 electrically couples the power supply terminal V to the power bus 45, and hence the power supply 15 coupled to terminal V is electrically coupled to the addressing circuitry 13 to thereby enable reading of data stored in the ROM component 10, as described in the above. On the other hand, when it is desired that the ROM component 10 be used as a non-power switch component, the manufacturer, or user, may so program the component 10 by placing a sufficiently "high" positive voltage to power switch program terminal 48 to break down zener diode 50, turn transistor 46 into a conducting state, and cause sufficient current to pass through fusible link FL to open circuit, or "blow", such fusible link. With fusible link FL in this open circuit state, power supply terminal V is electrically decoupled from the collector of transistor 46. Once so programmed, the power switch circuit 42 no longer responds to the chip enable signal fed thereto via terminal $\overline{CE}$, but rather such power switch circuit 42 continues to electrically couple power supply terminal V to the power bus 45 independently of the signal at terminal $\overline{CE}$. Thus, the user in open circuiting the fusible link FL, as described, converts the ROM 10 to a non-power switched component.

Referring in more detail to the power switch circuit 42, it is noted that such circuit 42 includes a transistor 60 having a grounded collector and a base coupled to terminal $\overline{CE}$. One of the pair of emitter electrodes of transistor 60 is coupled to Schottky transistor 62 and also to the collector of transistor 46 through a resistor 64, as shown. The second one of the pair of emitters of transistor 60 is coupled to the base of a Schottky transistor 64 and also to the emitter of transistor 62 and also to the emitter of transistor 64 via a resistor 66, as shown. The emitter of transistor 64 is coupled to ground through a resistor 68 and to the base of a grounded emitter, Schottky transistor 70, as shown. The collector of transistor 64 is coupled to the base of transistor 73 and is also electrically coupled to the power supply terminal V through a resistor 72, as shown. It is also noted that the collector of transistor 62 is also electrically coupled to power supply terminal V through a resistor 74. The collector of transistor 73 is also coupled to the power supply terminal V and the emitter electrode of transistor 73 is coupled: (1) to the collector of transistor 70 via a Schottky diode 71; and (2) to the addressing circuitry 13 via the power bus 45, as shown. More particularly, here the addressing circuitry 13 includes transistor-transistor logic (TTL) circuitry of the type described in "Designing with TTL Integrated Circuits", pages 23-66, prepared by the IC Applications Staff of Texas Instruments Incorporated, edited by Robert L. Morris and John R. Miller and published by McGraw-Hill Book Company 1971. Thus, the power bus 45 is coupled to the $V_{CC}$ terminal of such TTL circuitry.

Considering first the operation of the power switch circuit 42 when the component 10 is to be programmed as a power switched component (i.e., with fusible link FL electrically coupling the collector of transistor 46 with the power supply terminal V) in the absence of a "low" chip enable signal at terminal $\overline{CE}$, that is when the voltage at such terminal $\overline{CE}$ is "high", transistor 60 is in an "off" or non-conducting condition. However, transistors 62, 64 and 70 are placed in a conducting condition. Transistor 73 will be in a non-conducting condition with the result that power bus 45 is electrically decoupled from power supply terminal V reducing power consumption by the component 10 during the stand-by mode. When the component 10 is enabled by a "low" chip enable signal fed to terminal $\overline{CE}$, transistor 60 is placed in a conducting condition and transistors 62, 64 and 70 are, therefore, in non-conducting states. Transistor 73 is biased to a conducting condition with the result that power bus 45 is electrically coupled to the power supply terminal V, thereby electrically coupling the power supply 15 fed to the power supply terminal V to the $V_{CC}$ terminal of addressing circuitry 13.

When the component 10 is configured as a non-power switched device, that is when the fusible link FL is open-circuited in the manner described above, the power supply 15 coupled to the power supply terminal V is electrically decoupled from line 56 with the result that transistor 60 remains in a non-conducting condition independently of whether the signal at terminal $\overline{CE}$ is a "high" or "low" signal, that is independent of whether the chip is enabled. Thus, transistors 60, 62, 64, 70 remain in a non-conducting state independent of the state of the chip enable signal on terminal $\overline{CE}$. However, the power supply 15 coupled to the power supply terminal V forward biases transistor 73 to a conducting condition, thereby electrically coupling the power supply 15 to power bus 45, independent of the chip enable signal on terminal $\overline{CE}$. Therefore, with fusible link FL open-circuited, the power supply 15 at power supply terminal V is electrically coupled to the power bus 45, independent of the state of the chip enable signal fed to terminal $\overline{CE}$.

Having described a preferred embodiment of the invention, it is now evident that the embodiments incorporating this concept may be used. For example, while the component 10 has been described as a read-only memory (ROM), such component may be a programmable read-only memory such as described in our U.S. Pat. No. 4,385,368, entitled "Programmable Read-Only Memory", issued May 24, 1983 and assigned to the same assignee as the subject patent application, in which case, the power bus 45 described herein would be coupled to the X address inverter section 30, Y address inverter section 54 and the base electrode of transistors $33_1$ to $33_{128}$ via resistors $34_1$–$34_{128}$, respectively, described in such U.S. Pat. No. 4,385,368. It is felt, therefore, that this invention should not be restricted to the described embodiment, but rather should be limited only by the spirit and scope of the appended claims.

What is claimed is:

1. A memory integrated circuit component comprising:
    (a) a memory;
    (b) means for addressing the memory; and,
    (c) means, programmable to either: (a) electrically couple or decouple the addressing means and a power supply selectively in accordance with an enable signal; or, (b) maintain the addressing means electrically coupled to the power supply independent of the enable signal.

2. The component recited in claim 1 wherein the programmable means comprises:
    (a) a power switch circuit responsive to a chip enable signal; and
    (b) a power switch program circuit responsive to a power switch program signal for programmable coupling or decoupling the power supply to or from the power switch circuit selectively in accordance with the power switch program signal.

3. The component recited in claim 2 wherein the power switch program circuit includes a fusible link coupled between the power supply and the power switch circuit.

4. A memory integrated circuit comprising:
    (a) a memory section;
    (b) addressing section means for addressing the memory section;
    (c) means for electrically coupling or decoupling the memory section and an output terminal selectively in accordance with an enable signal; and
    (d) means, programmable to either: electrically couple or decouple a power supply to the addressing section means selectively in accordance with the enable signal; or, maintain the power supply electrically coupled to the addressing section means independently of the enable signal.

* * * * *